(12) United States Patent
Kamimura et al.

(10) Patent No.: US 10,811,266 B2
(45) Date of Patent: Oct. 20, 2020

(54) SUBSTRATE LIQUID PROCESSING APPARATUS AND METHOD, AND COMPUTER-READABLE STORAGE MEDIUM STORING SUBSTRATE LIQUID PROCESSING PROGRAM

(71) Applicant: Tokyo Electron Limited, Tokyo (JP)

(72) Inventors: Fumihiro Kamimura, Kumamoto (JP); Hiromi Hara, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 690 days.

(21) Appl. No.: 14/966,026

(22) Filed: Dec. 11, 2015

(65) Prior Publication Data
US 2016/0184859 A1 Jun. 30, 2016

(30) Foreign Application Priority Data
Dec. 24, 2014 (JP) .................. 2014-259774

(51) Int. Cl.
*H01L 21/306* (2006.01)
*H01L 21/67* (2006.01)

(52) U.S. Cl.
CPC .. *H01L 21/30604* (2013.01); *H01L 21/67057* (2013.01); *H01L 21/67086* (2013.01); *H01L 21/67109* (2013.01); *H01L 21/67248* (2013.01)

(58) Field of Classification Search
CPC ......... H01L 21/30604; H01L 21/67057; H01L 21/67086; H01L 21/67109; H01L 21/67248
See application file for complete search history.

(56) References Cited

U.S. PATENT DOCUMENTS

| | | | | | |
|---|---|---|---|---|---|
| 4,506,127 | A | * | 3/1985 | Satoh | H05B 6/645 219/710 |
| 4,828,166 | A | * | 5/1989 | Wolf | A47J 27/62 219/496 |
| 4,980,017 | A | * | 12/1990 | Kaji | H01L 21/67075 134/108 |

(Continued)

FOREIGN PATENT DOCUMENTS

| JP | 2004-146739 A | 5/2004 |
|---|---|---|
| JP | 2013-093478 A | 5/2013 |

*Primary Examiner* — Allan W. Olsen
*Assistant Examiner* — Margaret D Klunk
(74) *Attorney, Agent, or Firm* — Abelman, Frayne & Schwab

(57) ABSTRACT

Provided is a substrate liquid processing apparatus that processes a substrate with a processing liquid. The substrate liquid processing apparatus includes: a processing liquid storage unit configured to store the processing liquid therein; a processing liquid heating unit configured to heat the processing liquid, a controller configured to control the processing liquid heating unit; a temperature sensor; and a concentration sensor connected to the controller. The controller is configured to: measure a concentration of the processing liquid with the concentration sensor, measure a temperature of the processing liquid with the temperature sensor, calculate a boiling point corresponding to the measured concentration of the processing liquid, and control the output of the processing liquid heating unit, based on the boiling point and the measured temperature of the processing liquid.

6 Claims, 4 Drawing Sheets

(56) References Cited

U.S. PATENT DOCUMENTS

| | | | | |
|---|---|---|---|---|
| 2003/0181040 A1* | 9/2003 | Ivanov | ............... | C23C 18/1628 |
| | | | | 438/687 |
| 2004/0157452 A1* | 8/2004 | Ogawa | .............. | H01L 21/31111 |
| | | | | 438/691 |
| 2005/0070422 A1* | 3/2005 | Chen | ..................... | B01J 29/005 |
| | | | | 502/64 |
| 2011/0290279 A1* | 12/2011 | Hyakutake | ........ | H01L 21/67086 |
| | | | | 134/18 |

* cited by examiner

SUBSTRATE LIQUID PROCESSING APPARATUS AND METHOD, AND COMPUTER-READABLE STORAGE MEDIUM STORING SUBSTRATE LIQUID PROCESSING PROGRAM

CROSS-REFERENCE TO RELATED APPLICATIONS

This application is based on and claims priority from Japanese Patent Application Nos. 2014-259774 filed on Dec. 24, 2014 with the Japan Patent Office, the disclosure of which is incorporated herein in its entirety by reference.

TECHNICAL FIELD

The present disclosure relates to a substrate liquid processing apparatus and a substrate liquid processing method for processing a substrate with a heated processing liquid. The present disclosure also relates to a computer readable storage medium storing a substrate liquid processing program.

BACKGROUND

Conventionally, when manufacturing, for example, a semiconductor component or a flat panel display, a processing such as, for example, etching or cleaning, is performed on a substrate such as, for example, a semiconductor wafer or a liquid crystal substrate using a processing liquid such as, for example, an etching liquid or a cleaning liquid by a substrate liquid processing apparatus.

One substrate liquid processing apparatus uses an aqueous solution, obtained by adjusting chemicals such as, for example, phosphoric acid to a predetermined concentration and a predetermined temperature with pure water, as processing liquid, and processes a substrate by immersing the substrate in a storage tank that stores the processing liquid therein. Alternatively, the substrate is processed with a processing liquid by storing the processing liquid in the storage tank, and ejecting the stored processing liquid towards a surface of the substrate.

The conventional substrate liquid processing apparatus controls the processing liquid to a predetermined concentration by heating the processing liquid to boil the liquid at a predetermined temperature. See, for example, Japanese Patent Laid-open Publication No. 2013-093478.

SUMMARY

The present disclosure is to provide a substrate liquid processing apparatus that processes a substrate with a processing liquid. The substrate liquid processing apparatus includes a processing liquid storage unit configured to store the processing liquid therein, a processing liquid heating unit configured to heat the processing liquid, a controller configured to control the processing liquid heating unit, a temperature sensor, and a concentration sensor connected to the controller. The controller is configured to: measure a concentration of the processing liquid with the concentration sensor, measure a temperature of the processing liquid with the temperature sensor, calculate a boiling point corresponding to the measured concentration of the processing liquid, and control the output of the processing liquid heating unit, based on the boiling point and the measured temperature of the processing liquid.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
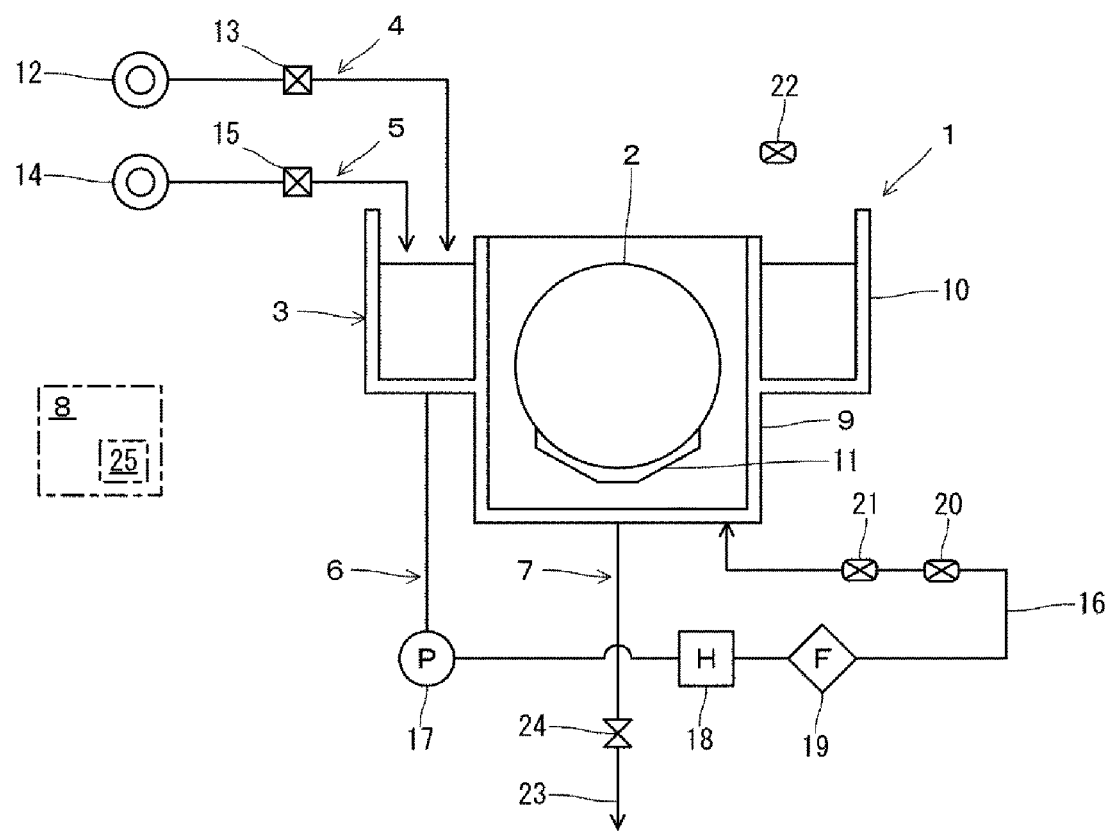
FIG. 1 is an explanatory view illustrating a substrate liquid processing apparatus.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

In the conventional substrate liquid processing apparatus, it is thought that a time required to heat the processing liquid is shortened by increasing the output of a heater that heats the processing liquid in order to improve a processing capability per unit time (throughput).

In the conventional substrate liquid processing apparatus, the heating of the processing liquid by the heater is controlled only by the temperature. When the processing liquid obtained by diluting the chemicals with the pure water is heated to a predetermined temperature within a short time by the high output heater, the processing liquid is rapidly heated to a temperature around a boiling point and thereby becomes a strong boiling state where the processing liquid is excessively boiled. As a result, the processing liquid may boil over from the storage tank. In particular, such a phenomenon may considerably occur in the following case: after the interior of the storage tank is substituted with water due to the maintenance of the storage tank and the processing liquid is stored in the storage tank again, the water used in the maintenance is mixed with the processing liquid, so that the concentration of the processing liquid stored in the storage tank is reduced and thus the boiling point of the processing liquid corresponding to the concentration is low.

Accordingly, the present disclosure provides a substrate liquid processing apparatus that processes a substrate with a processing liquid. The substrate liquid processing apparatus includes: a processing liquid storage unit configured to store the processing liquid therein; a processing liquid heating unit configured to heat the processing liquid, a controller configured to control the processing liquid heating unit; a temperature sensor; and a concentration sensor connected to the controller. The controller is configured to: measure a concentration of the processing liquid with the concentration sensor, measure a temperature of the processing liquid with the temperature sensor, calculate a boiling point corresponding to the measured concentration of the processing liquid, and control the output of the processing liquid heating unit, based on the boiling point and the measured temperature of the processing liquid.

In addition, the controller is configured to: perform a control of the processing liquid heating unit depending on the concentration and the temperature of the processing liquid, measure the temperature of the processing liquid with the temperature sensor, and then perform a control of the processing liquid heating unit only based on the measured temperature.

Furthermore, the controller is configured to perform a control to keep the output of the processing liquid heating unit constant between the control of the processing liquid heating unit depending on the concentration and the temperature of the processing liquid, and the control of the processing liquid heating unit only based on the temperature of the processing liquid.

The controller is configured to perform a correction depending on an atmospheric pressure when calculating the boiling point corresponding to the concentration of the processing liquid.

In addition, the present disclosure provides a substrate liquid processing method including: heating a processing liquid stored in a processing liquid storage unit using a processing liquid heating unit; measuring a concentration and a temperature of the processing liquid; calculating a boiling point corresponding to the measured concentration of the processing liquid; and controlling an output of the processing liquid heating unit based on the boiling point and the measured temperature of the processing liquid.

Further, the method of claim further includes: performing a control of the processing liquid heating unit depending on the concentration and the temperature of the processing liquid; measuring the temperature of the processing liquid; and performing a control of the processing liquid heating unit only based on the measured temperature of the processing liquid.

Further, the method further includes: performing a control to keep the output of the processing liquid heating unit constant between the control of the processing liquid heating unit depending on the concentration and the temperature of the processing liquid, and the control of the processing liquid heating unit only based on the temperature of the processing liquid.

Further, the method further includes: performing a correction depending on an atmospheric pressure when calculating the boiling point corresponding to the concentration of the processing liquid.

Furthermore, the present disclosure provides a non-transitory computer-readable storage medium storing a program that, when executed, causes a computer to control a substrate liquid processing method. The method includes: heating a processing liquid stored in a processing liquid storage unit using a processing liquid heating unit; measuring a concentration and a temperature of the processing liquid; calculating a boiling point corresponding to the measured concentration of the processing liquid; and controlling an output of the processing liquid heating unit based on the boiling point and the measured temperature of the processing liquid.

According to the present disclosure, it is possible to heat a processing liquid to a predetermined temperature in a short time while suppressing the processing liquid from becoming a strong boiling state, thereby improving the throughput of a substrate liquid processing apparatus.

Hereinafter, specific configurations of a substrate liquid processing apparatus, a substrate liquid processing method, and a substrate liquid processing program according to the present disclosure will be described with reference to the accompanying drawings. Further, in the following, descriptions will be made on an exemplary embodiment in which the present disclosure is applied to a substrate liquid processing apparatus (e.g., etching apparatus) of processing a substrate (e.g., a semiconductor wafer) using a processing liquid (e.g., etching liquid) obtained by adjusting chemicals such as, for example, phosphoric acid to a predetermined concentration and a predetermined temperature with pure water.

As illustrated in FIG. 1, the substrate liquid processing apparatus 1 includes a processing liquid storage unit 3 configured to process a substrate 2 with stored processing liquid, a processing liquid supply unit 4 configured to supply a processing liquid to the processing liquid storage unit 3, a pure water supply unit 5 configured to supply pure water to the processing liquid storage unit 3, a processing liquid circulating unit 6 configured to circulate the processing liquid stored in the processing liquid storage unit 3, and a processing liquid discharge unit 7 configured to discharge the processing liquid from the processing liquid storage unit 3. The substrate liquid processing apparatus 1 also has a controller 8 configured to control each of the above-mentioned units.

The processing liquid storage unit 3 includes a processing bath 9 that is opened at the top thereof, and an outer bath 10 that is provided around an upper portion of the processing bath and opened at the top thereof. The processing liquid is stored in the processing bath 9 and the outer bath 10. A substrate holder 11 holding the substrate 2 is provided in the processing liquid storage unit 3 to move up and down. The up-and-down movement of the substrate holder 11 is controlled by the controller 8.

In the processing bath 9, the substrate 2 is immersed in the processing liquid by the substrate holder 11 to be subjected to a liquid processing. The outer bath 10 stores a processing liquid overflowing from the processing bath 9, an aqueous solution supplied from the processing liquid supply unit 4, and pure water supplied from the pure water supply unit 5, and supplies the processing liquid to the processing bath 9 via the processing liquid circulating unit 6.

The processing liquid supply unit 4 connects an aqueous-solution supply source 12 that supplies the processing liquid, to the outer bath 10 of the processing liquid storage unit 3 via a flow-rate regulator 13. The opening/closing and the flow rate of flow-rate regulator 13 are controlled by the controller 8.

The pure water supply unit 5 connects a pure water supply source 14 that supplies pure water, to the outer bath 10 of the processing liquid storage unit 3 via a flow-rate regulator 15. The opening/closing and the flow rate of flow-rate regulator 15 are controlled by the controller 8.

The processing liquid circulating unit 6 forms a circulation path 16 between a bottom portion of the outer bath 10 of the processing liquid storage unit 3 and a bottom portion of the processing bath 9. A pump 17, a heater 18, and a filter 19 are sequentially provided on the circulation path 16. Further, a concentration sensor 20 that measures the concentration of the processing liquid and a temperature sensor 21 that measures the temperature of the processing liquid are provided on the circulation path 16. The temperature sensor 21 may be provided in the processing bath 9 of the processing liquid storage unit 3 without being limited to the circulation path 16. The driving of the pump 17 or the heater 18 is controlled by the controller 8. In particular, the output (heating temperature) of the heater 18 is variably controlled by the controller 8. The concentration sensor 20 or the temperature sensor 21 is connected to the controller 8, and notifies the controller 8 of a measured concentration or temperature. An atmospheric-pressure sensor 22 that measures atmospheric pressure in the vicinity of an opening of the processing bath 9 of the processing liquid storage unit 3 is also connected to the controller 8 to notify the controller 8 of the measured atmospheric pressure.

The processing liquid circulating unit 6 forcibly circulates the processing liquid from the outer bath 10 to the processing bath 9 by driving the pump 17. At that time, the heater 18 is driven to heat the processing liquid. Therefore, the heater 18 serves as a processing liquid heating unit for heating the processing liquid.

The processing liquid discharge unit 7 connects a drain 23 to the bottom portion of the processing bath 9 of the processing liquid storage unit 3 via an opening/closing valve 24. The opening/closing valve 24 is controlled to be opened or closed by the controller 8.

In the substrate liquid processing apparatus 1, the processing liquid is supplied to the processing liquid storage unit 3 by the processing liquid supply unit 4, the processing liquid is heated and regulated in the processing liquid heating unit (heater 18) such that the processing liquid becomes a predetermined concentration and a predetermined temperature by the processing liquid circulating unit 6, and the regulated processing liquid is stored in the processing bath 9. At this time, in the substrate liquid processing apparatus 1, a quantity of pure water corresponding to a quantity of water evaporated by heating is supplied to the processing liquid storage unit 3 by the pure water supply unit 5. Further, in the substrate liquid processing apparatus 1, a part (or all) of the processing liquid of the processing liquid storage unit 3 is discharged by the processing liquid discharge unit 7, and an aqueous solution is newly supplied by the processing liquid supply unit 4, thus exchanging the processing liquid stored in the processing liquid storage unit 3.

The above-described operations of the substrate liquid processing apparatus 1 are controlled by the controller 8. The controller 8 is, for example, a computer, and is provided with a computer-readable storage medium 25. The storage medium 25 stores a program for controlling various processes that are executed in the substrate liquid processing apparatus 1. The controller 8 reads and executes the program stored in the storage medium 25 to control the operations of the substrate liquid processing apparatus 1. Further, the program may be a program that have been stored in any other storage medium and is installed in the computer-readable storage medium 25 of the controller 8 from the other storage medium. Examples of the computer-readable storage medium 25 include, for example, a hard disc (HD), a flexible disc (FD), a compact disc (CD), a magnet optical disc (MO), and a memory card.

Figure 4:
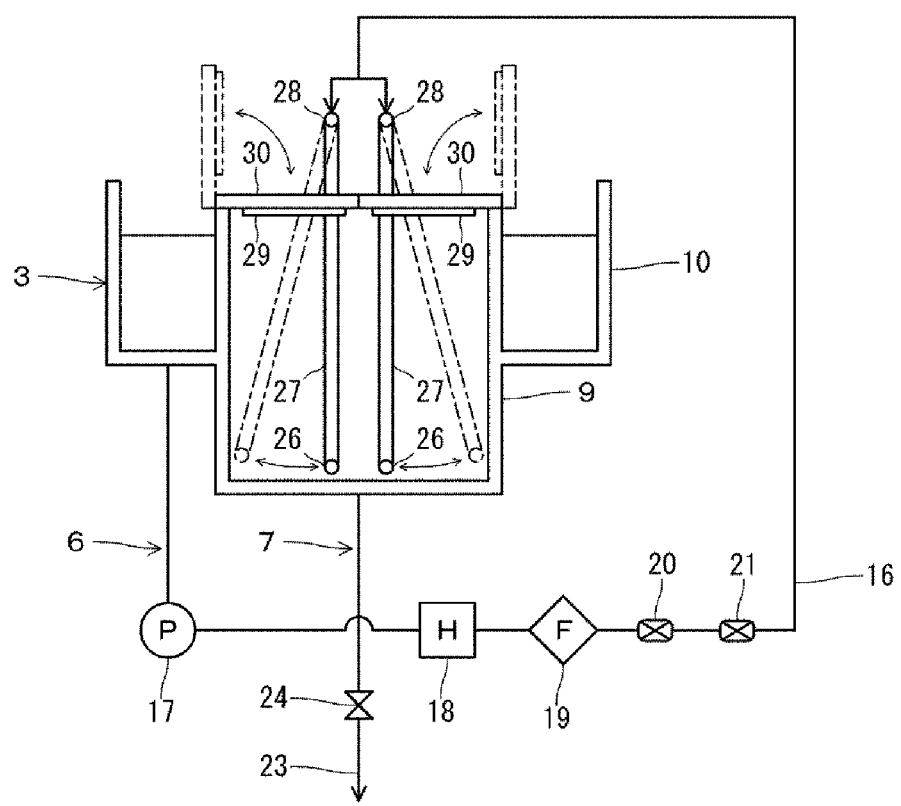
FIG. 4 is an explanatory view illustrating a storage tank.

As illustrated in FIG. 4, the substrate liquid processing apparatus 1 may movably accommodate a pair of nozzles 26, 26 that eject the processing liquid into the processing bath 9 so that the processing liquid stored in the processing bath 9 may be stirred and mixed by moving each nozzle 26. Here, each nozzle 26 is attached to a lower end of one of a pair of arms 27, 27, while a joint 28 is rotatably attached to an upper end of each arm 27. A mechanism that shakes the arms 27 is connected to the arms 27. An end of the circulation path 16 is divided into two branches that are connected to the joints 28, respectively. The processing liquid is supplied from the circulation path 16 to the nozzles 26, 26 through the joints 28, 28 and the arms 27, 27.

The substrate liquid processing apparatus 1 may be configured such that a cover 30 equipped with a heater 29 is provided on the opening of the processing bath 9 to be capable of opening/closing the opening of the processing bath 9, and the cover 30 is closed to cause the heater 29 to be immersed in the processing liquid so as to heat (keep warmth of) the processing liquid stored in the processing bath 9. Here, a pair of covers 30, 30 are rotatably attached to the edge of the opening end of the processing bath 9, and the heater 29 is attached to the rear surface of each cover 30. The opening of the processing bath 9 is closed by the pair of covers 30, 30. In addition, the heater 29 is immersed in the processing liquid in the state where each cover 30 is closed.

Figure 2:
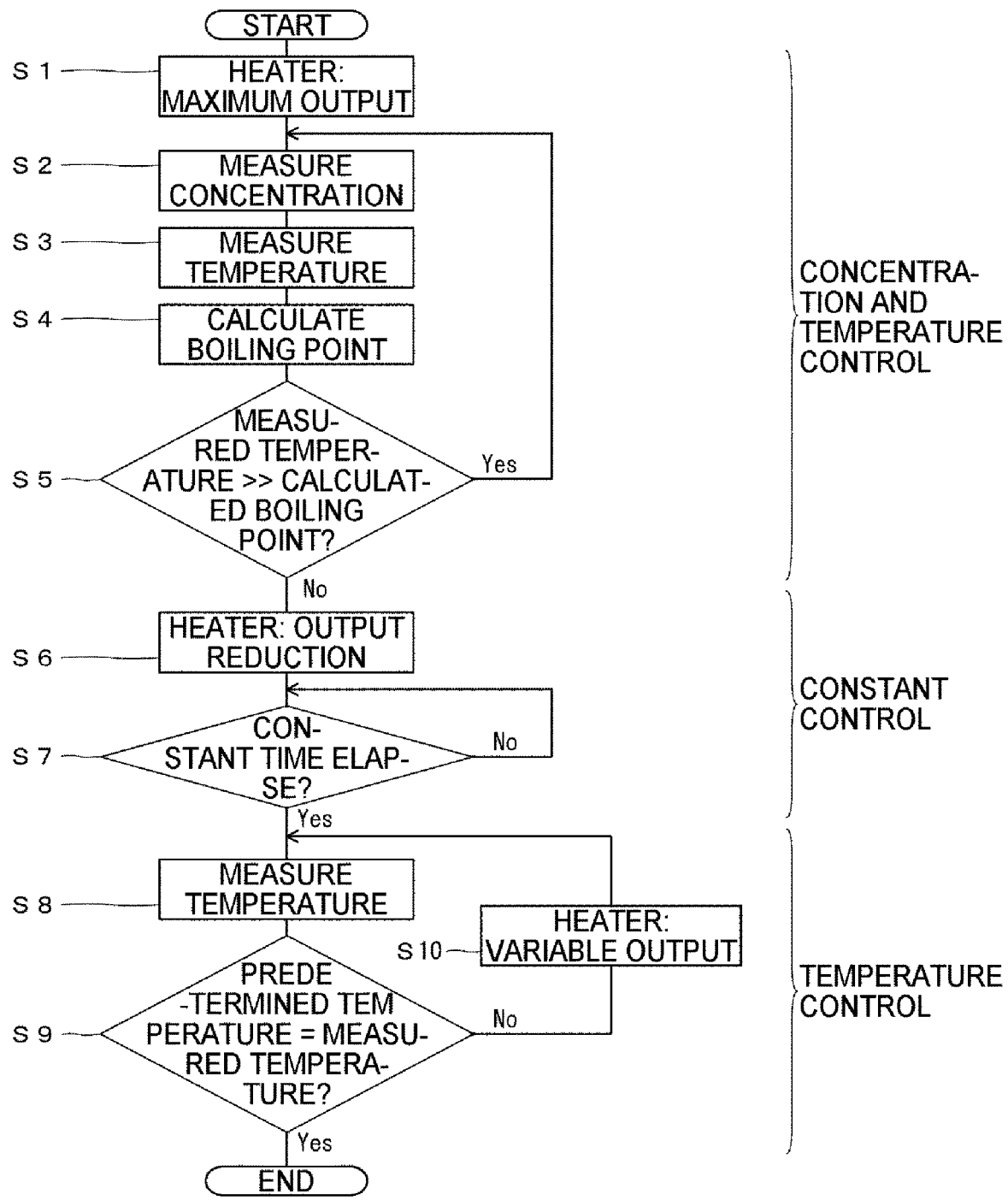
FIG. 2 is a flowchart illustrating a substrate liquid processing method.
Figure 3:
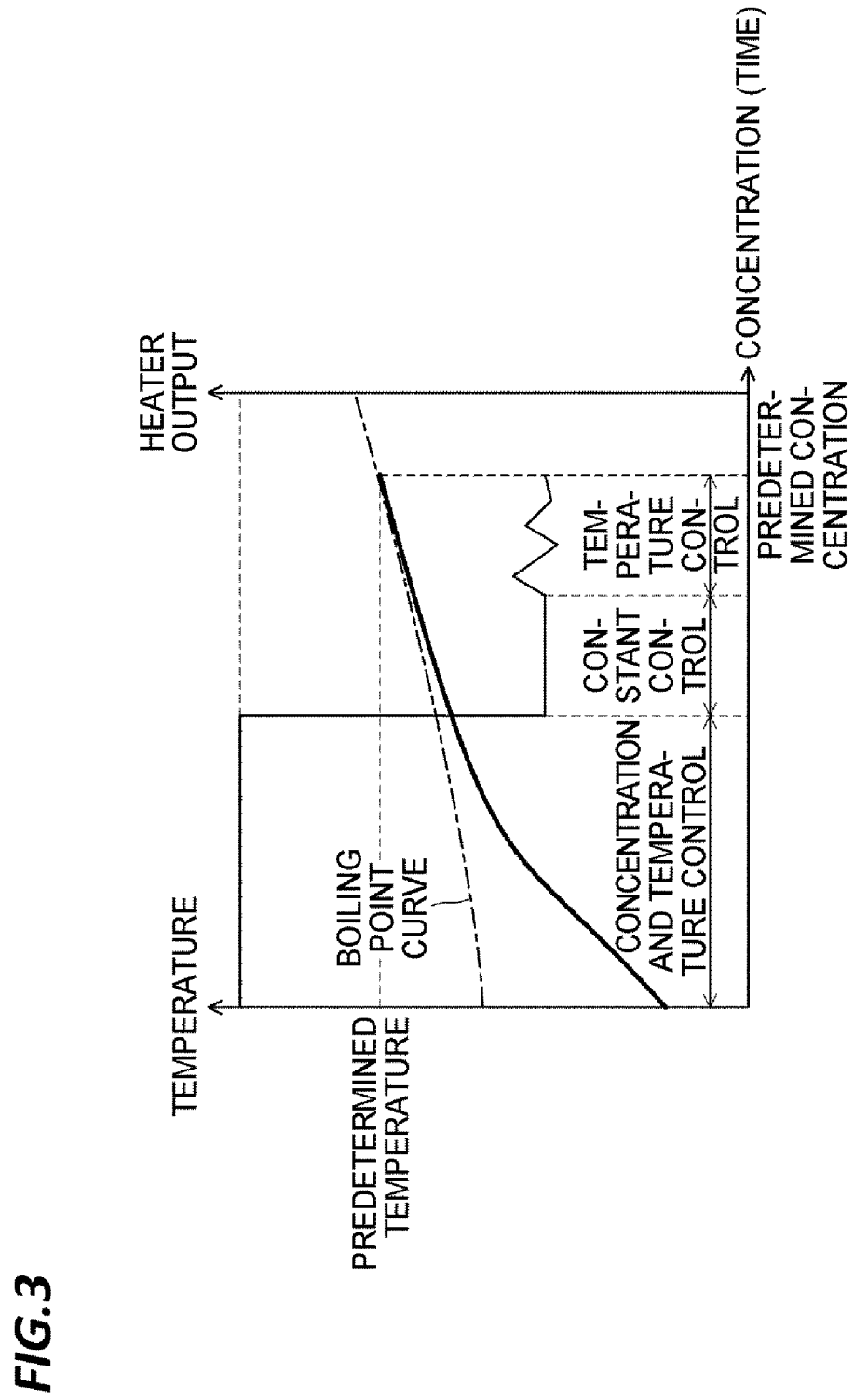
FIG. 3 is an explanatory view illustrating changes in a concentration and a temperature of a processing liquid and an output of a processing liquid heating unit.

The substrate liquid processing apparatus 1 is configured as described above. In the case of liquid-processing the substrate 2 using the substrate liquid processing apparatus 1, the substrate liquid processing apparatus 1 is controlled by the controller 8 according to the substrate liquid processing program stored in the storage medium 25. In particular, in the substrate liquid processing apparatus, the controller 8 performs controls to be described below (see, e.g., FIGS. 2 and 3) when the processing liquid stored in the processing liquid storage unit 3 is regulated to a predetermined concentration and a predetermined temperature.

First, the controller 8 performs a concentration and temperature control to control the output of the processing liquid heating unit (heater 18) based on the concentration and the temperature of the processing liquid.

In the concentration and temperature control, first, the controller 8 drives the pump 17 to circulate the processing liquid in the processing liquid circulating unit 6, and drives the heater 18 to heat the processing liquid (step S1). At this time, the controller 8 drives the heater 18 to a predetermined output (e.g., the maximum output of the heater 18).

Thereby, the processing liquid is heated by the heater 18 so that with the lapse of time, the temperature of the processing liquid is increased and water contained in the processing liquid is evaporated so that the concentration of the processing liquid is also increased. Since the concentration of the processing liquid is increased with the lapse of time, the concentration of a horizontal axis of FIG. 3 corresponds to the lapse of time.

Thereafter, the controller 8 measures the concentration of the processing liquid with the concentration sensor 20 (step S2), and measures the temperature of the processing liquid by the temperature sensor 21 (step S3).

Subsequently, the controller 8 calculates the boiling point of the processing liquid that corresponds to the concentration measured by the concentration sensor 20 (step S4). The boiling point may be calculated as follows: a correspondence relationship between the boiling point and the concentration of the processing liquid is maintained as data in advance, and the boiling point may be calculated from the data. Further, a function of calculating the boiling point from the concentration may be prepared in advance.

When calculating the boiling point of the processing liquid, a correction may be made depending on atmospheric-pressure fluctuation factors (e.g., an altitude or an average atmospheric pressure) in a place where the substrate liquid processing apparatus 1 is actually installed in consideration of a fact that the boiling point is affected by the atmospheric pressure as well as the concentration. For example, the boiling point to be used for the control may be calculated by maintaining, as data, a correction coefficient depending on the altitude of the place where the substrate liquid processing apparatus 1 is actually installed, and multiplying the boiling point calculated from the concentration by the correction coefficient. In the case of more precisely performing the correction, the atmospheric-pressure sensor 22 may be provided, and the boiling point may be corrected in real time depending on the atmospheric pressure measured by the atmospheric-pressure sensor 22.

Subsequently, the controller 8 compares the temperature of the processing liquid measured by the temperature sensor 21 (measured temperature) with the calculated boiling point (calculated boiling point) (step S5). Further, the measurement by the temperature sensor 21 may be performed until the measured temperature is compared with the calculated boiling point, and the temperature measurement may not be performed while conducting the concentration measurement by the concentration sensor 20.

In the case where the measured temperature is sufficiently higher than the calculated boiling point (in the case where the difference between the measured temperature and the calculated boiling point is equal to or larger than a predetermined temperature difference), the controls of steps S2 to S5 are repeatedly performed while maintaining the heater 18 at a predetermined output.

Meanwhile, in the case where the measured temperature is close to the calculated boiling point (in the case where the difference between the measured temperature and the calculated boiling point is less than a predetermined temperature difference), the temperature of the processing liquid rapidly approaches the boiling point and thereby the processing liquid abruptly boils (strong boiling) when the processing liquid is heated with the output (maximum output) of the heater 18. As a result, the processing liquid boils over from the processing bath 9 and contaminates surroundings.

Thus, when the measured temperature is close to the calculated boiling point (when the difference between the measured temperature and the calculated boiling point is less than a predetermined temperature difference) as a result of comparing the measured temperature with the calculated boiling point, a control to reduce the output of the processing liquid heating unit (heater 18) to a predetermined output and to keep the output kept constant (constant control) is performed.

In this constant control, the controller 8 reduces the output of the heater 18 such that the output of the heater 18 becomes the predetermined output (e.g., 40% of the maximum output) at step S6.

By reducing the output of the heater 18 when the measured temperature approaches the calculated boiling point, the strong boiling of the processing liquid may be suppressed and thus the contamination resulting from the boiling over of the processing liquid may also be suppressed.

Thereafter, the controller 8 keeps the output of the heater 18 constant until a predetermined time elapses (step S7). Here, the output of the heater 18 is kept constant until a predetermined time elapses. However, the concentration or the temperature of the processing liquid may be measured by the concentration sensor 20 or the temperature sensor 21 and then the output of the heater 18 may be kept constant until the concentration or temperature reaches a predetermined concentration or temperature.

After the predetermined time elapses, the controller 8 performs a temperature control to control the output of the processing liquid heating unit (heater 18) based on only the temperature of the processing liquid.

In this temperature control, the controller 8 measures the temperature of the processing liquid by the temperature sensor 21 (step S8).

Subsequently, the controller 8 compares the temperature measured by the temperature sensor 21 (measured temperature) with a predetermined temperature that has been previously set (step S9).

When the temperature of the processing liquid does not reach the predetermined temperature, the output of the heater 18 is varied based on the measured temperature (step S10).

Thereby, in the substrate liquid processing apparatus 1, the processing liquid may be heated to a predetermined temperature. At this time, the concentration of the processing liquid becomes the predetermined concentration so that the processing liquid may be regulated to the predetermined concentration and the predetermined temperature.

As described above, in the substrate liquid processing apparatus 1, the controller 8 measures the concentration of the processing liquid with the concentration sensor 20, and the temperature of the processing liquid with the temperature sensor 21, calculates the boiling point corresponding to the measured concentration of the processing liquid, and controls the output of the processing liquid heating unit (heater 18) based on the boiling point and the measured temperature of the processing liquid (concentration and temperature control).

Therefore, the substrate liquid processing apparatus 1 may heat the processing liquid to a predetermined temperature within a short time while suppressing the processing liquid from becoming the strong boiling state. Therefore, the throughput of the substrate liquid processing apparatus 1 can be enhanced.

Further, the present disclosure may perform a liquid processing using a processing liquid that has heated the substrate. The substrate liquid processing apparatus may be a batch processing type that is configured to simultaneously immerse a plurality of substrates in a processing liquid stored in the processing liquid storage unit, or may be a single substrate processing type that is configured to process substrates one by one with the processing liquid supplied from the processing liquid storage unit.

When the measured temperature is close to the calculated boiling point (when the difference between the measured temperature and the calculated boiling point is less than a predetermined temperature difference) as a result of comparing the measured temperature with the calculated boiling point, the substrate liquid processing apparatus 1 performs a control to reduce the output of the processing liquid heating unit (heater 18) to a predetermined level and keep the output constant (constant control). However, without being limited thereto, when the measured temperature is close to the calculated boiling point (when the difference between the measured temperature and the calculated boiling point is less than a predetermined temperature difference), the output of the processing liquid heating unit (heater 18) may be varied such that the processing liquid becomes the predetermined temperature and the processing concentration while keeping the measured temperature of the processing liquid close to the calculated boiling point.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate liquid processing apparatus that processes a substrate using a processing liquid, the apparatus comprising:

a processing liquid bath configured to store the processing liquid therein;

a processing liquid heater configured to heat the processing liquid;
a controller configured to control the processing liquid heater; and
a temperature sensor, a concentration sensor, and an atmospheric pressure sensor connected to the controller,
wherein the controller is configured to:
measure a concentration of the processing liquid with the concentration sensor to obtain a measured concentration,
measure a temperature of the processing liquid with the temperature sensor to obtain a first measured temperature,
calculate a boiling point corresponding to the measured concentration of the processing liquid to obtain a calculated boiling point,
correct the calculated boiling point based on an ambient atmospheric pressure measured with the atmospheric pressure sensor to obtain a corrected boiling point,
reduce an output of the processing liquid heater to a predetermined constant output when the first measured temperature of the processing liquid is within a predetermined range below the corrected boiling point for a predetermined time to prevent the processing liquid from reaching the corrected boiling point;
measure a temperature of the processing liquid after the predetermined time to obtain a second measured temperature; and
vary an output of the processing liquid heater based only on the second measured temperature of the processing liquid as compared to a fixed predetermined temperature corresponding to a predetermined concentration until the second measured temperature of the processing liquid rises to reach the fixed predetermined temperature,
wherein the calculated boiling point and the corrected boiling point both increase as the processing liquid is heated by the processing liquid heater, and
wherein the processing liquid is configured to be supplied to a substrate at the fixed predetermined temperature and the predetermined concentration.

2. A substrate liquid processing method comprising:
heating a processing liquid stored in a processing liquid bath using a processing liquid heater;
measuring a concentration and a temperature of the processing liquid to obtain a measured concentration and a first measured temperature, respectively;
calculating a boiling point corresponding to the measured concentration of the processing liquid to obtain a calculated boiling point;
correcting the calculated boiling point based on an ambient atmospheric pressure to obtain a corrected boiling point;
reducing an output of the processing liquid heater to a predetermined constant output when the first measured temperature of the processing liquid is within a predetermined range below the corrected boiling point for a predetermined time to prevent the processing liquid from reaching the corrected boiling point;
measuring a temperature of the processing liquid after the predetermined time to obtain a second measured temperature;
varying an output of the processing liquid heater based only on the second measured temperature of the processing liquid as compared to a fixed predetermined temperature corresponding to a predetermined concentration until the second measured temperature of the processing liquid rises to reach the fixed predetermined temperature; and
processing a substrate with the processing liquid, the processing liquid being at the fixed predetermined temperature and the predetermined concentration,
wherein the calculated boiling point and the corrected boiling point both increase as the processing liquid is heated by the processing liquid heater.

3. The method of claim 2, further comprising:
repeating the measuring of the concentration and the temperature of the processing liquid and the calculating the boiling point when the difference between the first measured temperature and the calculated boiling point is higher than a predetermined difference.

4. The method of claim 2, wherein the ambient atmospheric pressure is measured in real time.

5. The method of claim 2, wherein the ambient atmospheric pressure is measured using an atmospheric pressure sensor.

6. A non-transitory computer-readable storage medium storing a program that, when executed, causes a computer to control a substrate liquid processing method, the method comprising:
heating a processing liquid stored in a processing liquid bath using a processing liquid heater;
measuring a concentration and a temperature of the processing liquid to obtain a measured concentration and a first measured temperature, respectively;
calculating a boiling point corresponding to the measured concentration of the processing liquid to obtain a calculated boiling point;
correcting the calculated boiling point based on an ambient atmospheric pressure to obtain a corrected boiling point;
reducing an output of the processing liquid heater to a predetermined constant output when the first measured temperature of the processing liquid is within a predetermined range below the corrected boiling point for a predetermined time to prevent the processing liquid from reaching the corrected boiling point;
measuring a temperature of the processing liquid after the predetermined time to obtain a second measured temperature; and
varying an output of the processing liquid heater based only on the second measured temperature of the processing liquid as compared to a fixed predetermined temperature corresponding to a predetermined concentration until the second measured temperature of the processing liquid rises to reach the fixed predetermined temperature;
processing a substrate with the processing liquid, the processing liquid being at the fixed predetermined temperature and the predetermined concentration,
wherein the calculated boiling point and the corrected boiling point both increase as the processing liquid is heated by the processing liquid heater.

* * * * *